(12) United States Patent
Horishita et al.

(10) Patent No.: US 8,404,089 B2
(45) Date of Patent: Mar. 26, 2013

(54) SPUTTERING METHOD

(75) Inventors: Yoshikuni Horishita, Kanagawa (JP); Shinobu Matsubara, Kanagawa (JP)

(73) Assignee: ULVAC, Inc., Kanagawa (JP)

( * ) Notice: Subject to any disclaimer, the term of this patent is extended or adjusted under 35 U.S.C. 154(b) by 232 days.

(21) Appl. No.: 12/989,438

(22) PCT Filed: May 20, 2009

(86) PCT No.: PCT/JP2009/059275
§ 371 (c)(1),
(2), (4) Date: Oct. 25, 2010

(87) PCT Pub. No.: WO2009/145093
PCT Pub. Date: Dec. 3, 2009

(65) Prior Publication Data
US 2011/0036707 A1    Feb. 17, 2011

(30) Foreign Application Priority Data

May 26, 2008 (JP) ................................ 2008-137089

(51) Int. Cl.
*C23C 14/34* (2006.01)
(52) U.S. Cl. ................ 204/192.12; 204/298.08
(58) Field of Classification Search ............. 204/192.12, 204/298.08
See application file for complete search history.

(56) References Cited

U.S. PATENT DOCUMENTS

| | | | |
|---|---|---|---|
| 5,303,139 A * | 4/1994 | Mark ............................... | 363/63 |
| 5,698,082 A * | 12/1997 | Teschner et al. ......... | 204/298.03 |
| 6,096,174 A * | 8/2000 | Teschner et al. ......... | 204/192.12 |
| 6,340,416 B1 * | 1/2002 | Goedicke et al. ........ | 204/192.12 |
| 2007/0000772 A1 | 1/2007 | Ramm et al. | |
| 2008/0143260 A1 | 6/2008 | Tuymer et al. | |
| 2008/0173536 A1 | 7/2008 | Ramm et al. | |
| 2008/0193782 A1 | 8/2008 | Ramm et al. | |

FOREIGN PATENT DOCUMENTS

| | | |
|---|---|---|
| JP | 09-172787 A | 6/1997 |
| JP | 11-146659 A | 5/1999 |

(Continued)

OTHER PUBLICATIONS

International Search Report for PCT Patent App. No. PCT/JP2009/059275 (Sep. 1, 2009).

*Primary Examiner* — Rodney McDonald
(74) *Attorney, Agent, or Firm* — Cermak Nakajima LLP; Tomoko Nakajima

(57) ABSTRACT

When sputtering method is performed by disposing a plurality of targets in parallel with each other, and by charging power to the targets through a plurality of bipolar pulsed power supplies, power can be charged with higher accuracy to the targets while being subject to less effect by the switching noises by a simple control. In a sputtering method in which, for each of targets making a pair, power is supplied in a bipolar pulsed mode by switching ON or OFF of each of the switching elements SW1 through SW4 in a bridge circuit that is connected to positive and negative DC output ends from the DC power supply source, and in which each of the targets is sputtered, switching ON or OFF of the switching elements is performed in a short-circuited state of an output-short-circuiting switching element SW0 which is disposed between positive and negative DC outputs from the DC power supply source. The timing of shifting the output-short-circuiting switching element is mutually deviated from bridge circuit to bridge circuit.

4 Claims, 4 Drawing Sheets

FOREIGN PATENT DOCUMENTS

| | | |
|---|---|---|
| JP | 2005-290550 A | 10/2005 |
| JP | 2006-249506 A | 9/2006 |
| JP | 2007-186726 A | 7/2007 |
| JP | 2008-533687 T | 8/2008 |

* cited by examiner large-area substrate to be processed in a sput-
SPUTTERING METHOD This application is a national phase entry under 35 U.S.C. §371 of PCT Patent Application No. PCT/JP2009/059275, filed on May 20, 2009, which claims priority under 35 U.S.C. §119 to Japanese Patent Application No. 2008-137078, filed May 26, 2008, both of which are incorporated by reference.

TECHNICAL FIELD

The present invention relates to a sputtering method for forming a predetermined thin film on the surface of a substrate to be processed such as of glass make and the like, and relates in particular to a sputtering method for sputtering each of the targets by supplying power in a bipolar pulsed mode to respective targets making a pair.

BACKGROUND ART

Conventionally, as an apparatus for efficiently forming a thin film on a large-area substrate to be processed in a sputtering method, there is known a sputtering apparatus in which a plurality of targets are disposed in parallel with each other in a manner to lie opposite to the substrate to be processed, inside a vacuum chamber. Among these targets disposed in parallel with each other, plural sets of bipolar pulsed power supplies are assigned to respective pairs of targets. While each of the bipolar pulsed power supplies is operated in synchronization, power is supplied (outputted) to each of the targets by alternately changing the polarity. Each of the targets is thus switched alternately between anode electrode and cathode electrode. Glow discharge is caused to be generated between the anode electrode and the cathode electrode to thereby form a plasma atmosphere so that each of the targets is sputtered (patent document 1).

Generally, the bipolar pulsed power supply is constituted by a rectifying circuit which supplies DC current, and a MOSFET bridge circuit which is connected to the positive and the negative output ends of the rectifying circuit and which is made up of four switching elements. Each of the switching elements is appropriately operated by the control means to charge pulse voltage at a predetermined frequency to the targets that make a pair. According to this arrangement, there is an advantage in that the electric charges to be accumulated on the surface of the targets are cancelled when an opposite phase voltage is charged, thereby obtaining a stable discharge.

Patent Document: JP-A-2005-290550

DISCLOSURE OF THE INVENTION

Problems to be Solved by the Invention

However, in the above-mentioned art, switching noises are generated at the time of switching the output to each of the targets. These switching noises become more remarkable with the increase in the number of bipolar pulsed power supplies disposed in parallel with each other. If large switching noises occur, the waveform of the charging power to the targets will get into disorder and, as a result, there is a possibility that the power cannot be charged to the targets with high accuracy.

Therefore, in view of the above points, this invention has a problem of providing a sputtering method which is capable of charging power to the targets with high accuracy while minimizing the influence of the switching noises with a simple control, and which in turn enables to form a good thin film.

Means for Solving the Problems

In order to solve the above problems, the sputtering method according to this invention comprises: supplying power to each pair of targets which are disposed in a plurality of pieces arranged in parallel with and at a predetermined distance from each other, opposite to a substrate to be processed inside a sputtering chamber, the power being supplied in a bipolar pulsed mode by switching ON or OFF of each of switching elements in a bridge circuit connected to positive and negative DC output ends from a DC power supply source; alternately switching each of the targets to anode electrode and cathode electrode to cause glow discharge to take place between the anode electrode and the cathode electrode, whereby a plasma atmosphere is formed to sputter the targets. In a short-circuited state of an output-short-circuiting switching element which is disposed between the positive and the negative DC outputs from the DC power supply source, the switching elements are switched ON or OFF, and a switching timing of the output-short-circuiting switching element is mutually deviated.

According to this invention, since the output-short-circuiting switching element is provided, the number of switching elements to be operated at the time of output switching of each of the targets can be reduced. Further, since the timing of switching of the output-short-circuiting switching element is mutually deviated, large switching noises can be prevented from getting generated at the same time. As a result of these combined effects, even if the number of the bipolar pulsed power supplies to be connected in parallel increases, the power can be charged with higher accuracy to each of the targets that make respective pairs, thereby enabling to form a good thin film.

Further, by employing the above-mentioned arrangement, the switching loss can be made to occur only in a single output-short-circuiting switching element. In addition to the improvement in its durability, its control is easy because it is sufficient only to control the timing of switching ON or OFF of the output-short-circuiting switching element.

Further, preferably, the supplying of power to each of the targets is performed through a bus bar which connects the output ends of the bridge circuit and each of the targets. Then, as compared with the case in which, e.g., a conventional AC cable made by twisting a large number of wires is used, the case in this invention can be made less subject to the effects of the noises. Therefore, the power can be charged to a pair of targets with higher accuracy.

This invention preferably further comprises: detecting output current between the pair of targets; recognizing a phenomenon in which an absolute value of the output current exceeds a steady output current value as a pre-stage phenomenon of arcing; and extinguishing the arcing by cutting off the output to each of the targets by means of the output-short-circuiting switching element. Then, control can be made with better response than the case in which the processing of extinguishing the arcing is made by controlling the two switching elements that are being outputted. Even during this processing, there occurs little or no switching loss to each of the switching elements in the bridge circuit, whereby the durability can be further improved.

Effects of the Invention

As explained hereinabove, this invention has an effect in that the sputtering method of this invention can be made less subject to the effect of switching noises by a simple control and that the power can be charged with higher accuracy.

BEST MODE FOR CARRYING OUT THE INVENTION

With reference to FIG. 1, reference numeral 1 denotes a sputtering apparatus for carrying out the sputtering method of this invention. The sputtering apparatus 1 is of an in-line system, and has a vacuum chamber 11 which can maintain a predetermined vacuum degree through an evacuating means such as a rotary pump, a turbo-molecular pump and the like (not illustrated), whereby a sputtering chamber 11a is constituted. On an upper part of the vacuum chamber 11, there is provided a substrate transport means 2, which has a known construction and has, e.g., a carrier 21 on which a substrate S to be processed is mounted in position. By intermittently driving drive a means (not illustrated), the substrate S to be processed is sequentially transported to a position which lies opposite to targets which are described hereinafter. On a lower side of the vacuum chamber 11 there is disposed a cathode electrode C.

The cathode electrode C has eight targets 31a through 31h which are disposed so as to lie opposite to the substrate S to be processed. Each of the targets 31a through 31h is made of Al, Ti, Mo, indium and tin oxide (ITO) or an alloy of indium and tin oxide, and the like into the same shape, e.g., substantially into a rectangular parallelopiped (rectangle in plan view) in a known method depending on the composition of the thin film to be formed on the surface of the substrate S to be processed. Each of the targets 31a through 31h is coupled, through a bonding material such as indium, tin, and the like, to a backing plate 32 which cools the targets during sputtering. They are disposed at an equal distance to each other so that the sputtering surfaces 311 (i.e., the surfaces to be sputtered) before they are put to actual use lie on the same plane that is parallel with the substrate S to be processed. Each of the targets 31a through 31h are arranged so that adjoining two make a pair, and that four bipolar pulsed power supplies E1 through E4 which are assigned to the targets making respective pairs are connected thereto.

The bipolar pulsed power supplies E1 through E4 have the same structure and, as illustrated in FIG. 2, are each made up of a DC power supply unit 4 which enables to supply DC power, and an oscillation unit 5 which controls the output (power supply) to each of the targets 31a, 31b (31c and 31d, 31e and 31f, 31g and 31h). The DC power supply unit 4 has: a first CPU circuit 41 which controls the operation thereof; an input part 42 which receives input of commercial AC power supply (three-phase AC 200V or 400V); and a rectifying circuit 43 which is made up of six diodes 43a and rectifies the inputted AC power to DC power. Through positive and negative DC power lines 44a, 44b, DC power is outputted to the oscillation unit 5.

The DC power supply unit 4 is provided with: a switching transistor 45 which is disposed between DC power lines 44a, 44b; and an output oscillation driver circuit 46 which is connected to the first CPU circuit 11 (41) in a manner capable of communication therewith so as to control the ON or OFF of the switching transistor 45. Between the DC power lines 44a, 44b, there is connected a detection circuit 47a which detects the current and voltage thereof. The current and voltage detected by the detection circuit 47a are arranged to be inputted to the first CPU circuit 41 through an AD converter circuit 47b.

On the other hand, the oscillation unit 5 is provided with: a second CPU circuit 51 which is connected to the first CPU circuit 41 in a manner capable of communication therewith; a bridge circuit 52 which is made up of first through fourth, a total of four, switching transistors SW1 through SW4 which are connected to the positive and negative DC power lines 14a, 14b; and an output oscillation driver circuit 53 which is connected to the second CPU circuit 51 in a manner capable of communication therewith and controls the ON or OFF switching of each of the switching transistors SW1 through SW4.

When control is made of switching of each of the switching transistors SW1 through SW4 so that, by the output oscillation driver circuit 53, the ON-OFF timing can be reversed, e.g., of the first and the fourth switching transistors SW1, SW4, and of the second and the third switching transistors SW2, SW3, power can be supplied in a bipolar pulsed mode to the pair of targets 31a, 31b through output lines 54a, 54b from the bridge circuit 52. The wave form of the output voltage is substantially rectangular or substantially sinusoidal. To the output lines 54a, 54b there is connected a detection circuit 55 which detects an output current and an output voltage to the pair of targets 31a, 31b. The output current and the output voltage detected by this detection circuit 55 are arranged to be inputted to the second CPU circuit 51 through an AD converter circuit 56.

Here, in the above-mentioned bipolar pulsed power supplies E1 through E4, if each of the switching transistors SW1 through SW4 is switched at the same time in a state in which the DC power is being outputted from the DC power supply unit 4, not only will the switching loss be large, but also will the waveform of the power to be charged to the targets 31a through 31h becomes turbulent under the influence of the switching noises. There is thus a possibility that good thin film forming will be impaired.

In this embodiment, the following arrangement has been employed. In other words, between the positive and negative DC output lines 44a, 44b from the DC power supply unit 4, there is provided a switching transistor SW0 for short-circuiting the output (also called "output-short-circuiting switching transistor") whose ON-OFF switching is controlled by the output oscillation driver circuit 43. In a state of short-circuiting of the output-short-circuiting transistor SW0 (i.e., in a state in which the output to the targets 31a, 31b is cut off), the switching of each of the switching transistors SW1 through SW4 in the bridge circuit 52 can be made. In addition, there is provided a central control means 6 which is made up of a CPU connected, in a manner capable of communication, with the second CPU circuit 51 of each of the bipolar pulsed power supplies E1 through E4. By this central control means 6 the switching timing of the output-short-circuiting switching element SW0 is mutually deviated for each of the bipolar pulsed power supplies E1 through E4, i.e., mutually deviated from bridge circuit 52 to bridge circuit 52.

In other words, as shown in FIG. 3, in a short-circuited state of the output-short-circuiting switching transistor SW0 of each of the bipolar pulsed power supplies E1 through E4, each of the switching transistors SW1 through SW4 is operated: so that the ON-OFF timing can be reversed with respect to the first and the fourth switching transistors SW1, SW4, and with respect to the second and the third switching transistors SW2, SW3 of each of the bipolar pulsed power supplies E1 through E4; and so that the polarity to the mutually adjoining targets 41a through 41h can be reversed. Thereafter, the short-circuiting of the switching transistor SW0 is released for a predetermined period of time by the output from the central control means 6 so that output can be made to one 41a, 41c, 41e, 41g of the targets that make respective pairs.

Thereafter, by means of an output from the central control means 6, the output-short-circuiting switching transistor SW0 of each of the bipolar pulsed power supplies E1 through E4 is short-circuited simultaneously or sequentially. After switching each of the switching transistors SW1 through SW4, the short-circuiting of the switching transistor SW0 is released simultaneously or sequentially by the output from the central control means 6, and output is made to each of the other 41b, 41d, 41f, 41h of the targets. By thus repeating the above-mentioned control, each of the targets 41a through 41h is supplied with power in a bipolar pulsed mode at a predetermined frequency, thereby performing synchronized operation. In case the switching timing of the output-short-circuiting switching element is deviated, it is sufficient if deviation is made of the switching timing of at least one out of each of the output-short-circuiting switching transistors SW0 of each of the bipolar pulsed power supplies E1 through E4. In this case, the remaining output-short-circuiting switching transistors SW0 may be deviated simultaneously or in a manner mutual with each other. In addition, for example, each of the output-short-circuiting switching transistors SW0 of each of the bipolar pulsed power supplies E1 through E4 may alternatively be divided into a plurality of groups so that respective ones making respective sets can be switched simultaneously.

According to this arrangement, there can be prevented large switching noises from occurring simultaneously, the absence of the switching noises being due to the combined effects in that: by providing the output-short-circuiting switching transistor SW0, the number of switching elements that operate at the time of output switching to each of the targets 31a through 31h has been reduced; and that the timing of switching the output-short-circuiting switching transistor SW0 is mutually deviated from the bridge circuit 52 to the bridge circuit 52. As a result, even in case the number is large of the bipolar pulsed power supplies E1 through E4 that are connected in parallel with each other, power can be charged with high accuracy to each of the targets 31a through 31h that make respective pairs, thereby enabling good thin film forming.

In order to perform good power supply without being influenced by the noises, it is preferable: to dispose the oscillation unit 5 that is arranged to be separated from the power supply unit 4 in close proximity to the vacuum chamber 11; and to use bus bars as the output lines 54a, 54b that connect the output ends of the bridge circuit 52 to the targets 31a through 31h. The bus bars are made, e.g., of Cu, Au, Ag or an aluminum alloy which is high in electric conductivity, and are formed extendible and contractible so as to absorb the possible errors in distance between the oscillation unit 5 and the targets 31a through 31h. According to this arrangement, as compared with the case of using known AC cables made, e.g., by twisting a multiplicity of cables, this arrangement is less subject to the influence of the noises. Therefore, power can be charged to the pair of targets 31a through 31h with higher accuracy.

Then, the carrier 21 on which the substrate S to be processed has been set in position is transported by the substrate transport means 2 to the position lying opposite to the targets 31a through 31h that are disposed in is parallel with each other. At a predetermined pressure (e.g., $10^{-5}$ Pa) a sputtering gas (and a reactive gas) is introduced through a gas introducing means 5 (not illustrated). Power is charged to the targets 31a through 31h through bipolar pulsed power supplies E1 through E4. Each of the targets 31a through 31h is alternately switched between anode electrode and cathode electrode. Glow discharge is thus caused to be generated between the anode electrode and the cathode electrode, thereby forming a plasma atmosphere. Each of the targets 31a through 31h is thus sputtered, thereby forming a predetermined thin film on the surface of the substrate S to be processed.

During the above-described glow discharge, there are cases where arcing may take place for one cause or another. Once arcing has occurred, the plasma impedance suddenly becomes small, resulting in the occurrence of a sudden voltage drop and a consequent current increase. Therefore, in this embodiment, there was provided an arc detection control circuit 57 which receives inputs in the form of the output current and the output voltage as detected by the detection circuit 55, the arc detection control circuit 57 being provided in a manner capable of communication with the second CPU circuit 51 (see FIG. 1). If the output current varies beyond a certain range in any one of the bipolar pulsed power supplies E1 through E4, it is taken or recognized as a pre-stage phenomenon of arcing (micro-arc). By performing the processing of arc-extinction of arcing, the generation of arcing with a large arc current is suppressed.

In other words, when the output current detected by the detection circuit 55 has exceeded a steady output current value, the arc detection control circuit 57 will recognize it as a pre-stage phenomenon of arcing. The output-short-circuiting switching transistor SW0 is short-circuited (ON) by the output oscillation driver circuit 53, through the second CPU circuit and the arc detection control circuit 57. When the output-short-circuiting switching transistor SW0 is short-circuited (ON), each of the switching transistors SW1 through SW4 in the bridge circuit 52 is held in a state of outputting to one 31a or 31b (31c or 31d, 31e or 31f, 31g or 31h) of the targets. As a result of short-circuiting of the switching transistor SW0, the output to the targets 31a through 31h will be cut-off (micro-arc processing).

Then, after a lapse of a predetermined period of time (several µs to several hundreds µs), short-circuit of the output-short-circuiting switching transistor SW0 is released (OFF), and the output to either side of the targets will be resumed depending on the operating conditions of each of the switching transistors SW1 through SW4. At this time, a judgment is made by the arc detection control circuit 57 as to whether the output current has exceeded a steady output current value or not. If the output current still exceeds the steady output current value, output-short-circuiting switching transistor SW0 is short-circuited again by the output oscillation driver circuit 53.

Despite the repeated series of micro-arc processing several times, if the output current remains exceeding the steady output current value, or if the output current exceeds a predetermined value that has been set in advance, a judgment is made that arcing which induces the occurrence of splashes or particles will occur. The switching transistor 45 is thus switched ON by the control of the first CPU circuit 41, and the output from the DC power supply unit 4 is stopped (hard-arc processing). Since, during this processing, little or no switching loss will occur to each of the switching transistors SW1 through SW4, the durability can be further improved.

Figure 1:
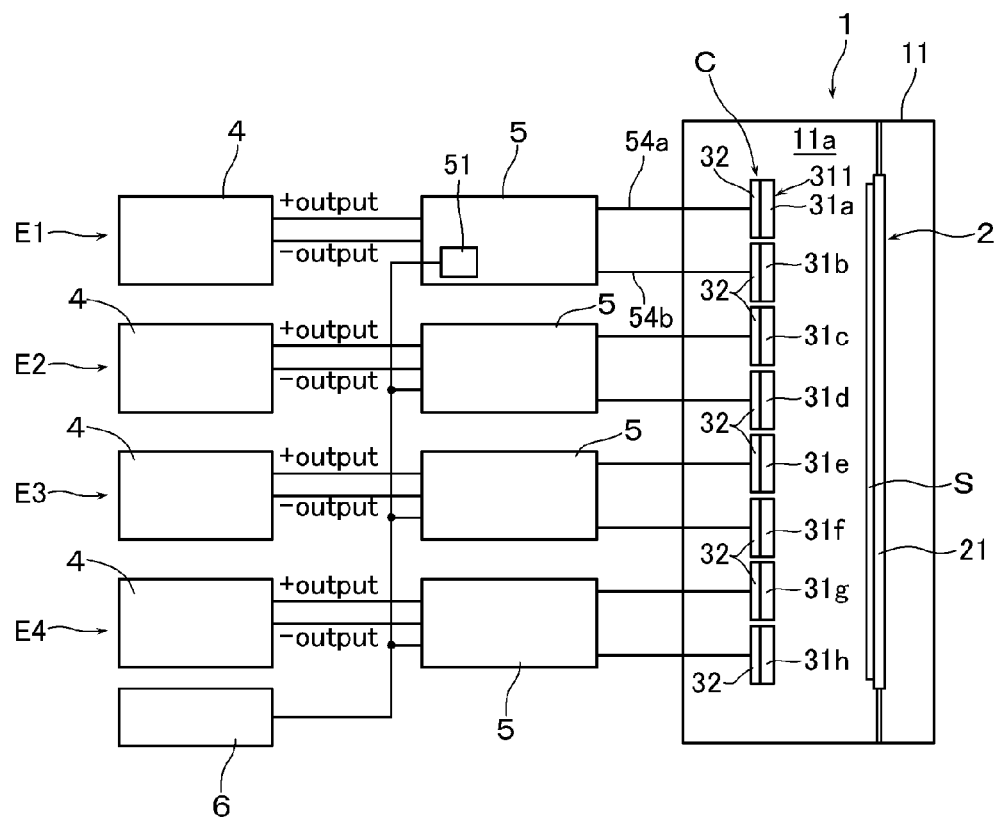
FIG. 1 is a block diagram schematically showing an arrangement of a sputtering apparatus to perform the sputtering method according to this invention.
Figure 2:
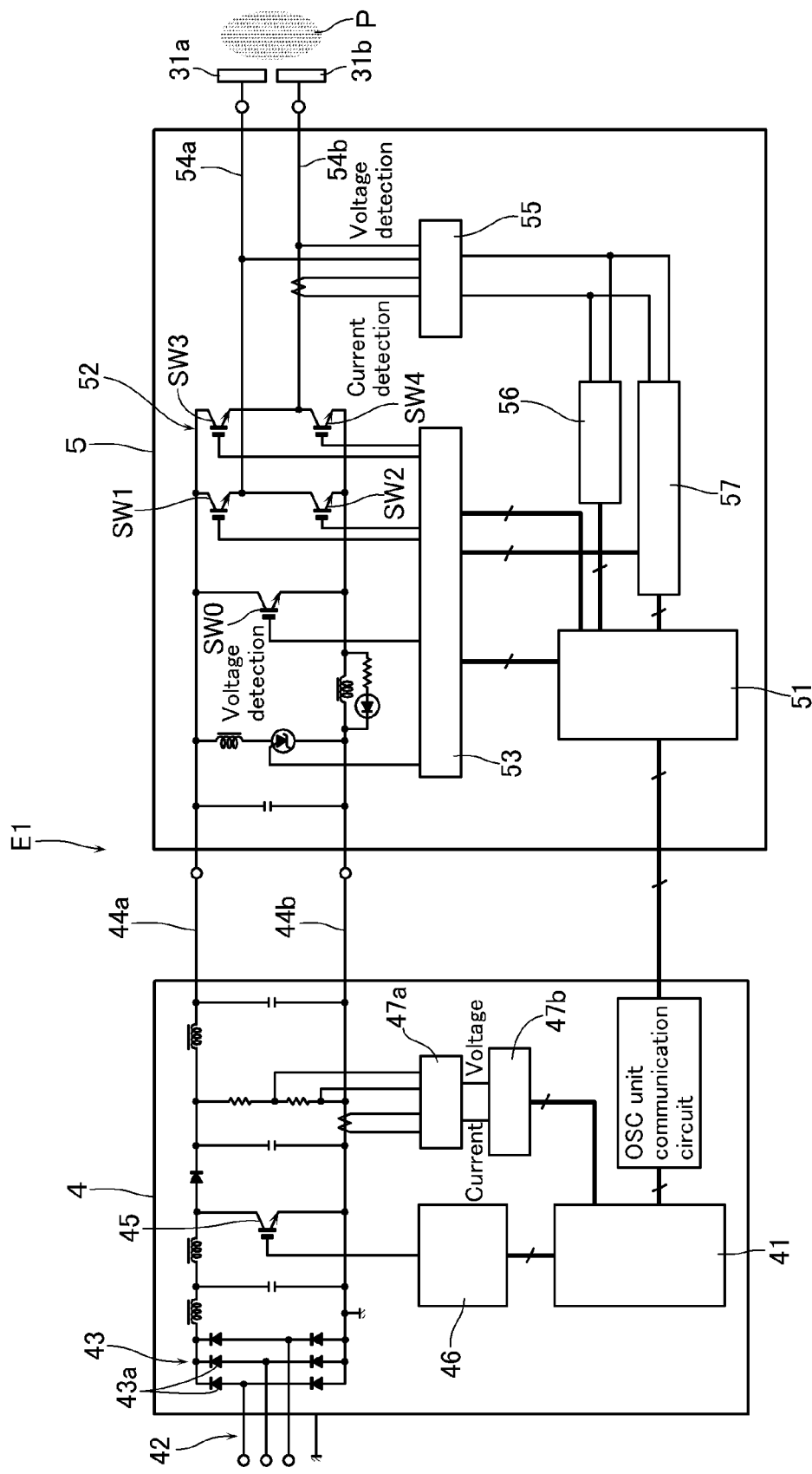
FIG. 2 is a block diagram schematically showing an arrangement of a bipolar pulsed power supply to be used in the sputtering apparatus shown in FIG. 1.
Figure 3:
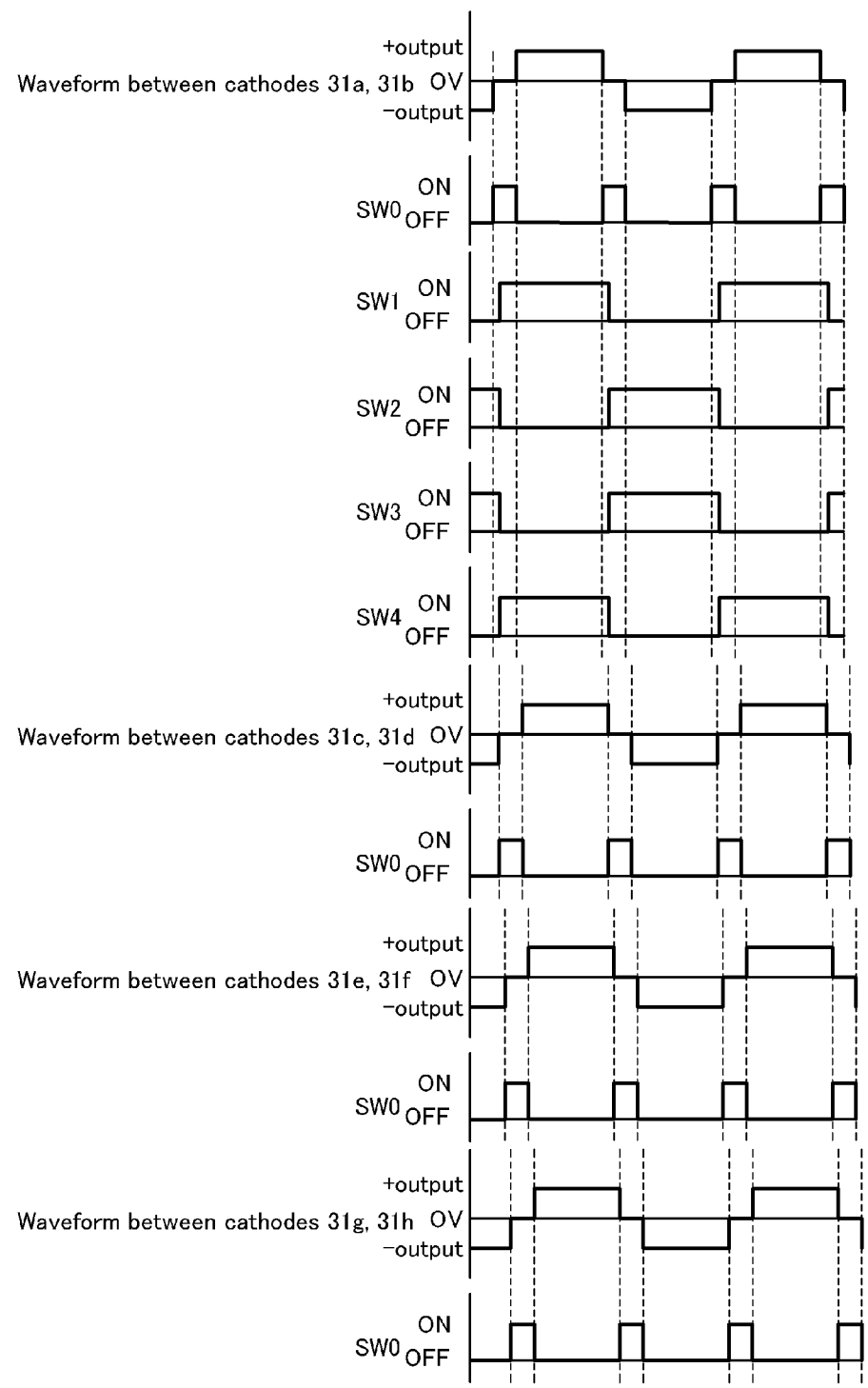
FIG. 3 is a diagram showing the timing of operation of switching elements.
Figure 4:
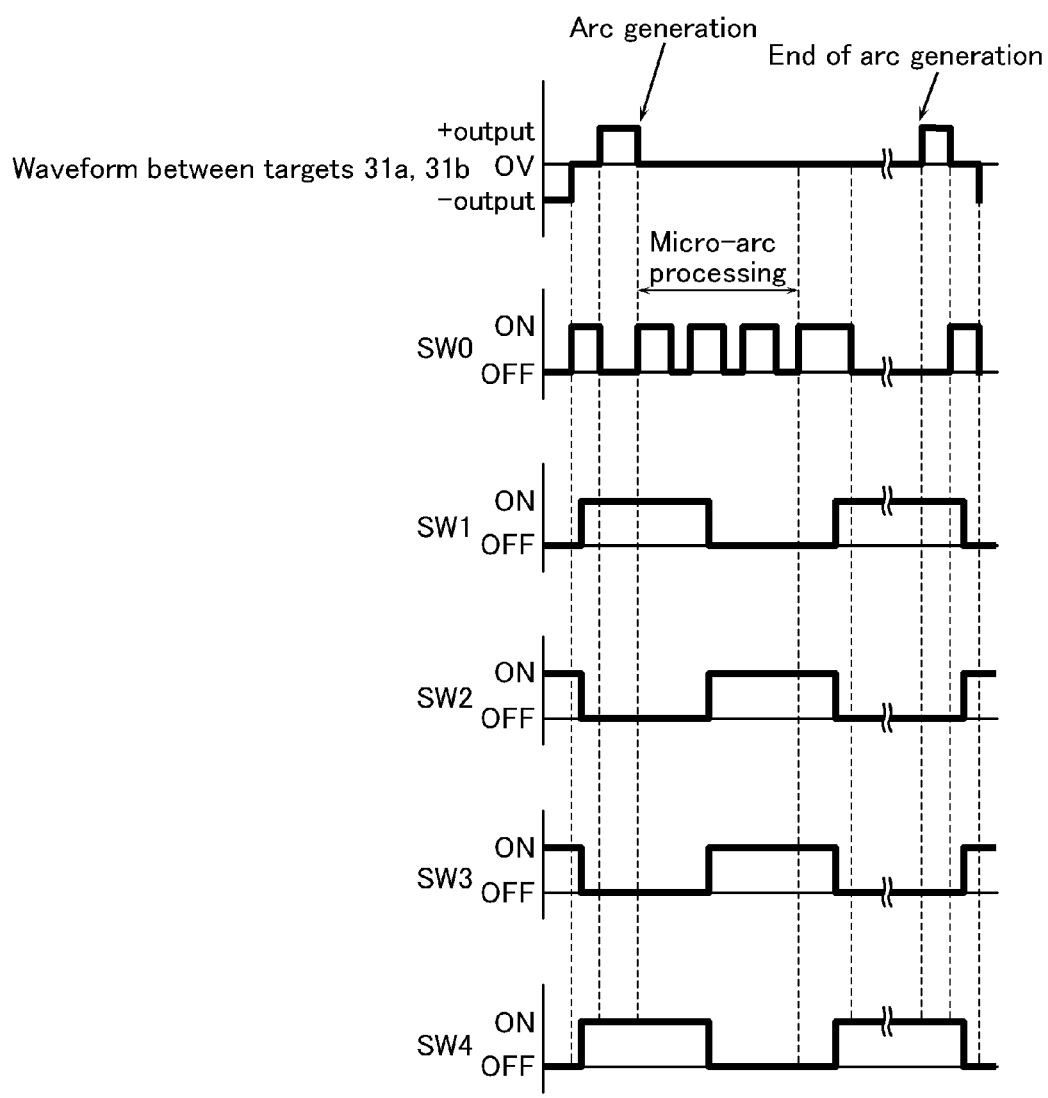
FIG. 4 is a diagram showing a micro-arc processing in each of the bipolar pulsed power supplies.

DESCRIPTION OF REFERENCE NUMERALS AND CHARACTERS 1 sputtering apparatus
2 substrate transporting means
31a through 31h targets
4 power supply unit
5 oscillation unit
52 bridge circuit
54a, 54b bus bars
6 central control means
E1 through E4 bipolar pulsed power supplies
S substrate to be processed
SW0 through SW4 switching elements

What is claimed is:

1. A sputtering method comprising:
supplying power to at least one pair of targets which are disposed in a plurality of pieces arranged in parallel with and at a predetermined distance from each other, opposite to a substrate to be processed inside a sputtering chamber, the power being supplied in a bipolar pulsed mode by switching ON or OFF of each of switching elements in a bridge circuit connected to positive and negative DC output ends from a DC power supply source; and
alternately switching each target of the at least one pair of targets to anode electrode and cathode electrode to cause glow discharge to take place between the anode electrode and the cathode electrode, whereby a plasma atmosphere is formed to sputter the targets,
wherein, during a short-circuited state of an output-short-circuiting switching element which is disposed between the positive and the negative DC outputs from the DC power supply source, the switching elements are operated such that ON or OFF timing is reversed, and a switching timing of the output-short-circuiting switching element is mutually deviated.

2. The sputtering method according to claim 1, wherein the supplying of power to each of the targets is performed through a bus bar which connects the output ends of the bridge circuit and each of the targets.

3. The sputtering method according to claim 1, further comprising:
detecting output current between the at least one pair of targets;
recognizing a phenomenon in which an absolute value of the output current exceeds a steady output current value as a pre-stage phenomenon of arcing; and
extinguishing the arcing by cutting off the output to each of the targets by means of the output-short-circuiting switching element.

4. The sputtering method according to claim 2, further comprising:
detecting output current between the at least one pair of targets;
recognizing a phenomenon in which an absolute value of the output current exceeds a steady output current value as a pre-stage phenomenon of arcing; and
extinguishing the arcing by cutting off the output to each of the targets by means of the output-short-circuiting switching element.

* * * * *